(12) United States Patent
Watanabe

(10) Patent No.: US 8,283,192 B2
(45) Date of Patent: Oct. 9, 2012

(54) METHOD OF FORMING PATTERN AND METHOD OF PRODUCING SOLID-STATE IMAGE PICKUP DEVICE

(75) Inventor: Kyouhei Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/113,230

(22) Filed: May 23, 2011

(65) Prior Publication Data

US 2011/0300662 A1 Dec. 8, 2011

(30) Foreign Application Priority Data

Jun. 2, 2010 (JP) ................................ 2010-127074
May 13, 2011 (JP) ................................ 2011-107731

(51) Int. Cl.
*H01L 21/00* (2006.01)
(52) U.S. Cl. ...................... 438/29; 438/70; 257/E21.598
(58) Field of Classification Search .................... 438/44, 438/707; 257/E21.483, E21.487, E21.527, 257/E21.532, E21.536, E21.598
See application file for complete search history.

(56) References Cited

U.S. PATENT DOCUMENTS

| 2006/0223200 A1 | 10/2006 | Maruyama |
| 2007/0275520 A1 | 11/2007 | Suzuki |
| 2009/0304324 A1 * | 12/2009 | Kim et al. ........................ 385/14 |

FOREIGN PATENT DOCUMENTS

| JP | 11-211908 A | 8/1999 |
| JP | 2006-310734 A | 11/2006 |
| JP | 2007-004082 A | 1/2007 |
| JP | 2007-317845 A1 | 12/2007 |

* cited by examiner

*Primary Examiner* — Cheung Lee
(74) *Attorney, Agent, or Firm* — Canon U.S.A., Inc. IP Division

(57) ABSTRACT

Provided is a method of forming a pattern including the steps of forming a first pattern including a depressed or protruding alignment mark on a substrate; forming a flattening layer on the first pattern; removing a part of the flatting layer above the alignment mark; forming a processed layer on the flattening layer to cover the alignment mark; performing alignment by optically detecting a position of the alignment mark from above the processed layer, using light; and forming a second pattern by patterning the processed layer on the basis of the alignment.

11 Claims, 5 Drawing Sheets

METHOD OF FORMING PATTERN AND METHOD OF PRODUCING SOLID-STATE IMAGE PICKUP DEVICE

BACKGROUND OF THE INVENTION

1. Field of the Invention

The present invention relates to a method of forming a pattern by photolithography and, more specifically, relates to the alignment during pattern formation.

2. Description of the Related Art

Methods of producing solid-state image pickup devices and display devices, which are optical function devices, according to the related art each include a step of forming a pattern with a blue filter, a black filter, and so on by photolithography. The blue filter, the black filter, and so on are made of materials having a low transmittance for many wavelengths of light. While performing alignment for producing patterns of such blue filter, black filter, and so on, the following problem may occur. Since the light used to detect an alignment mark (hereinafter, referred to as "alignment light") must transmit through the material of the blue filter, the black filter, and so on, the light reflected from the alignment mark is weak. As a result, it is difficult to detect the alignment mark.

To solve such a problem, in Japanese Patent Laid-Open No. 11-211908, a new alignment mark is formed using a material having a high alignment-light transmittance. A method of performing alignment for forming a pattern on a material having a low light transmittance using such a new alignment mark is described.

Japanese Patent Laid-Open No. 2007-004082 describes a method of detecting an alignment mark after selectively removing a material having low light transmittance above the alignment mark.

Since a new alignment mark is created when the technique described in Japanese Patent Laid-Open No. 11-211908 is used, the new alignment mark includes a shift component with respect to the original alignment. Moreover, since a pattern is formed on the basis of the new alignment mark, the alignment precision is reduced.

According to the technique described in Japanese Patent Laid-Open No. 2007-004082, since the material having a low light transmittance above the alignment mark is removed by photolithography, a step of forming a photo-resist mask pattern for removal is required. Accordingly, with the technique described in Japanese Patent Laid-Open No. 2007-004082, the number of steps in the process increases.

Accordingly, the present invention provides a method of forming a pattern on a material having a low alignment-light transmittance with high alignment precision and in fewer steps. The present invention also provides a structure of an alignment mark that enables the formation of a pattern on a material having a low alignment-light transmittance with high alignment precision and in fewer steps.

SUMMARY OF THE INVENTION

A method of forming a pattern according to the present invention includes: forming a first pattern including a depressed or protruding alignment mark on a substrate; forming a flattening layer on the first pattern; removing a part of the flatting layer above the alignment mark; forming a processed layer on the flattening layer to cover the alignment mark; performing alignment by optically detecting a position of the alignment mark from above the processed layer, using light; and forming a second pattern by patterning the processed layer based on the alignment.

A method of producing a solid-state image pickup device according to the present invention includes: forming a wiring layer including a depressed or protruding alignment mark above a substrate including a photoelectric conversion unit; forming a flattening layer on the wiring layer; removing a part of the flattening layer above the alignment mark in the wiring layer; forming a blue resist layer on the flattening layer with the part removed; performing alignment by optically detecting the position of the alignment mark from above the blue resist layer, using light; forming a blue color filter by patterning the blue resist layer on the basis of the alignment; removing a part of the blue resist layer above the alignment mark; forming a microlens layer above the alignment mark after removing a part of the blue resist layer; performing alignment by optically detecting the position of the alignment mark from above the microlens layer, using light; and forming a microlens by patterning or exposing the microlens layer on the basis of the alignment.

Further features of the present invention will become apparent from the following description of exemplary embodiments with reference to the attached drawings.

DESCRIPTION OF THE EMBODIMENTS

Details of embodiments will be described below with reference to the drawings.

First Embodiment

CMOS-type solid-state image pickup devices used in a three-CMOS camcorder according to this embodiment will be described with reference to FIGS. 1A to 1E and FIGS. 2 and 4.

Figure 4:
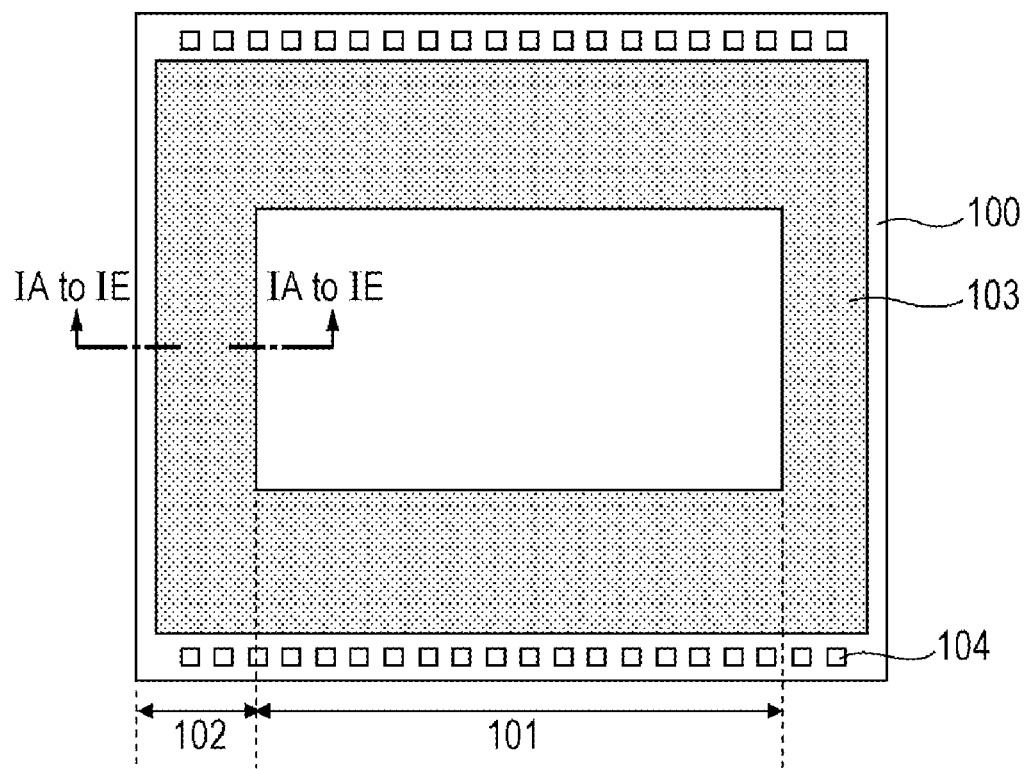
FIG. 4 is a schematic plan view of a solid-state image pickup device.

FIG. 4 is a schematic plan view of a solid-state image pickup device according to this embodiment. FIG. 4 illustrates one of a three-CMOS solid-state image pickup device 100, an effective pixel region 101, a periphery region 102, a light-shielding pattern 103, and pads 104. The effective pixel region 101 includes multiple pixels, each including a photoelectric conversion unit (for example, photodiode). The periphery region 102 is the region excepting the effective pixel region 101. The periphery region 102 includes optical black parts (OB parts) where the pixels are shielded and peripheral circuits that drive the solid-state image pickup device to read out signals and perform signal processing. The light-shielding pattern 103 is disposed in the periphery region 102 and shields the OB parts and peripheral circuits, which are disposed in the periphery region 102. The light-shielding pattern 103 is not disposed on the pads 104 to allow connection of the pads 104. The light-shielding pattern 103 may be disposed on the effective pixel region 101 to prevent light from entering regions other than the photoelectric conversion units. The light-shielding pattern 103 according to this embodiment is formed of a material having a low light transmittance. A method of forming the light-shielding pattern 103 will be described with reference to FIGS. 1A to 1E.

FIGS. 1A to 1E are schematic sectional views of the method of forming a pattern according to this embodiment. FIGS. 1A to 1E are schematic sectional views taken along line IA to IE in FIG. 4 and illustrate only the essential part of the solid-state image pickup device.

FIG. 1A illustrates an insulating layer 105, a passivation layer 106, an alignment mark 107, and a metal pattern 108 disposed in the periphery region 102. A semiconductor substrate (substrate) including wiring layers, insulating layers, and devices (not shown) is disposed below the insulating layer 105. The insulating layer 105 is, for example, a silicon dioxide film, and the passivation layer 106 is, for example, a silicon nitride film. The main component of the metal pattern 108 is, for example, aluminum. The passivation layer 106 has an in-layer lens in the effective pixel region 101. The alignment mark 107 is the same layer as the wiring layer (metal pattern). The wiring layer may be disposed on the insulating layer 105 in the effective pixel region 101 and the periphery region 102. Thus, the alignment mark 107 can be formed at the same time the wiring layer (metal pattern) is formed (first pattern formation). The photoelectric conversion units are disposed in the effective pixel region 101.

With the configuration illustrated in FIG. 1A, bumps may form on the upper surface of the insulating layer 105 due to the wiring layer (not shown). The upper surface of the passivation layer 106 may be have a bump at the boundary region between the effective pixel region 101 and the periphery region 102 because the metal pattern 108 is provided in the periphery region 102 but not in the effective pixel region 101. When the passivation layer 106 has an in-layer lens, the upper surface of the passivation layer 106 is uneven. To stably form various patterns in the subsequent steps, it is necessary to smooth out (flatten) the unevenness.

As illustrated in FIG. 1B, a flattening layer 109, which flattens the uneven upper surface, is formed. The flattening layer 109 is made of a photosensitive material. The material may be any type of photosensitive material, i.e., positive or negative photosensitive material have any photosensitive wavelength.

As illustrated in FIG. 1C, a pattern is formed in the flattening layer 109, which is made of a photosensitive material, by photolithography to remove the flattening layer 109 on and around the alignment mark 107. For example, when the flattening layer 109 is a positive resist, it is exposed using a photomask having a pattern that allows exposure light to be incident on a region of the resist according to the alignment mark 107, and then the resist is developed. Through such processing, the flattening layer 109 above and around the alignment mark 107 can be removed selectively.

Subsequently, a film made of a material having a low alignment-light transmittance (processed layer) is formed. The material having a low alignment-light transmittance is a material in which T≦5%, where T represents the average spectral transmittance in the wavelength band of the alignment light. The alignment light may be a He—Ne laser beam having a wavelength of approximately 633 nm. When a He—Ne laser beam is used, a material having an average spectral transmittance T of 5% or smaller is, for example, a blue resist or a black resist. In this embodiment, a blue resist is used to form a blue resist layer 110 in the effective pixel region 101 and the periphery region 102, as illustrated in FIG. 1D.

Alignment is performed by detecting the alignment mark 107 through the blue resist layer 110, which is illustrated in FIG. 1D. Since the flattening layer 109 is removed from above and around the alignment mark 107, a depression outlining the shape of the alignment mark 107 is formed in the upper surface of the blue resist layer 110. When the alignment light is incident on the depression (surface depression) in the surface of the blue resist layer 110, the incident light is scattered, enabling detection of the alignment mark 107. Subsequently, alignment based on the detection result of the alignment mark 107 is performed, and a pattern is formed by exposing and developing the blue resist layer 110 using photolithography. In this way, the light-shielding pattern 103 (second pattern) is formed in the periphery region 102 (FIG. 1E).

Figure 1:
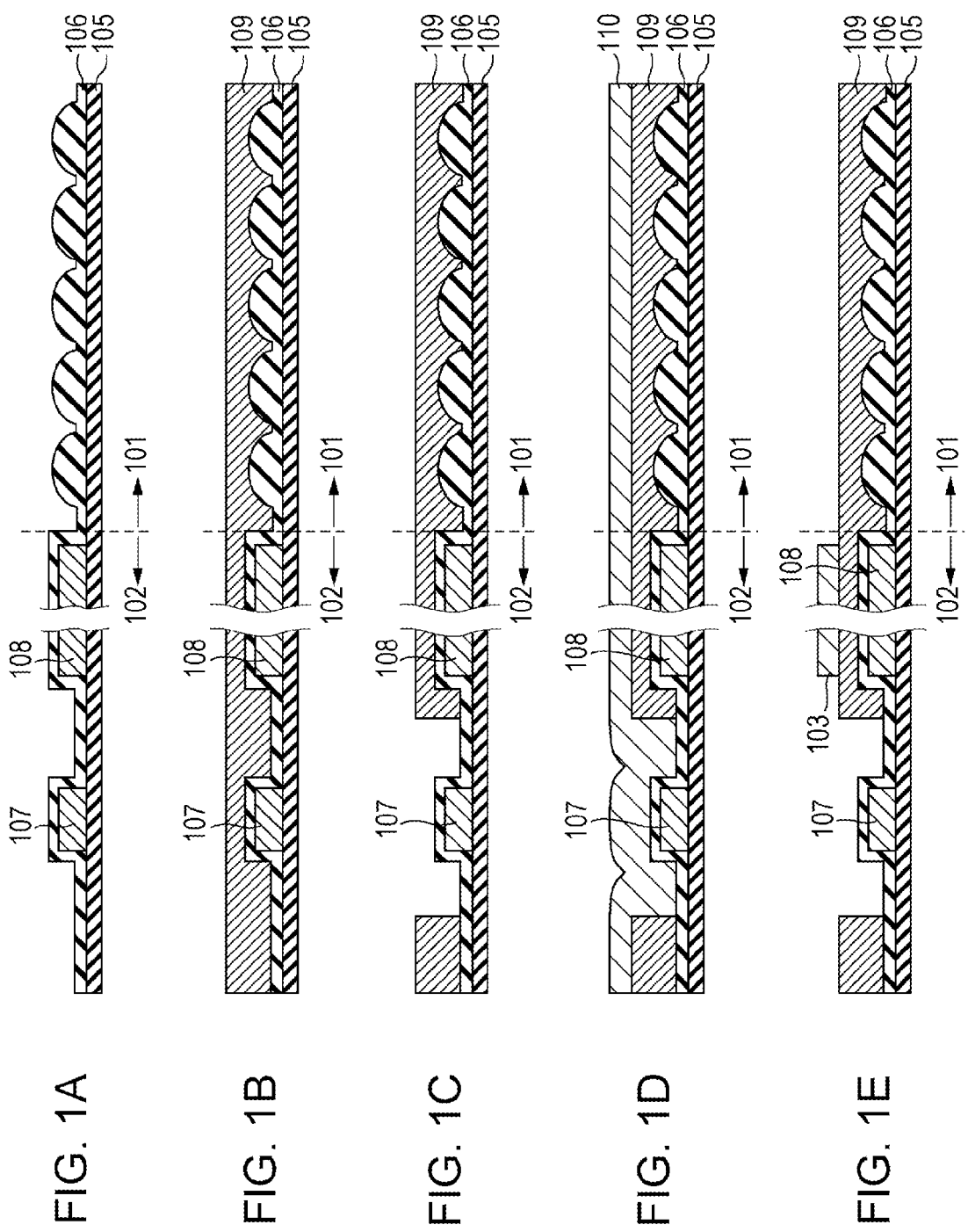
FIGS. 1A to 1E are schematic sectional views of a method of forming a pattern according to a first embodiment.
Figure 2:
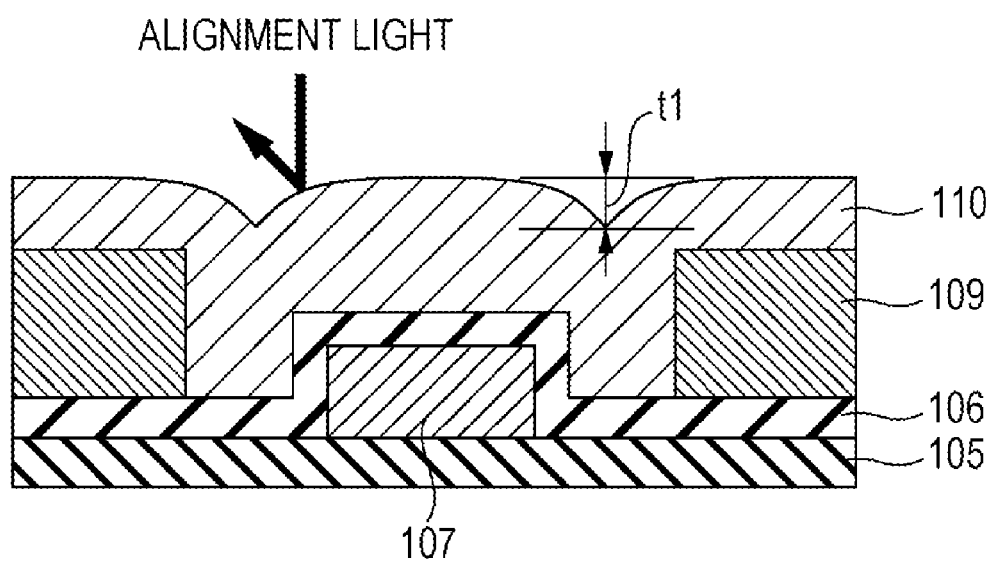
FIG. 2 is a schematic sectional view of a pattern according to the first embodiment.

With reference to FIG. 2, a method of detecting the alignment mark 107 is described below in detail. FIG. 2 is an enlarged sectional view of the alignment mark 107 and the periphery thereof illustrated in FIG. 1D. As illustrated in FIG. 2, since the flattening layer 109 is removed from above and around the alignment mark 107, a depression (t1>0) is formed in the surface of the blue resist layer 110. As illustrated in FIG. 2, this depression is optically detected from above the blue resist layer 110. Specifically, when the alignment light is incident on the surface depression in the blue resist layer 110, the alignment light is scattered. Through such scattering, the contrast of the outline of the alignment mark 107 can be enhanced in the alignment-mark detection optical system of the exposure apparatus. In this way, the alignment mark 107 can be detected.

This method of detecting the alignment mark does not use reflected alignment light that is transmitted through the film disposed on the alignment mark 107 but uses the light that scatters at the surface (surface depression) of the film disposed on the alignment mark 107. Thus, the alignment mark 107 can be correctly detected regardless of the transmittance of the film disposed on the alignment mark 107. Accordingly, even when the blue resist layer 110, which has a low alignment-light transmittance, is disposed on the alignment mark 107, the alignment mark 107 can be correctly detected.

As described above, according to this embodiment, it is possible to easily align a material having a low alignment-light transmittance in a three-CMOS solid-state image pickup device. Moreover, since the process is simple, high throughput is achieved at a low cost. When forming a pattern in a material having a low alignment-light transmittance, the original alignment mark 107, instead of a new alignment mark, can be used. Therefore, the alignment precision can be prevented from decreasing.

The structure of the alignment mark according to this embodiment, which is a structure in which the flattening layer 109 is removed from above and around the alignment mark 107, enables highly precise alignment in fewer steps.

The alignment mark 107 according to this embodiment is disposed on the insulating layer 105. The position of the alignment mark 107, however, is not limited thereto. The alignment mark 107 may be disposed outside the pads 104, which are illustrated in FIG. 4, on the solid-state image pickup device 100 and, for example, may be disposed in the scribe region. When the alignment mark 107 is disposed in the scribe region, it may be removed before the solid-state image pickup device 100 is completed.

Second Embodiment

In this embodiment, a single CMOS-type solid-state image pickup device will be described. This embodiment differs from the first embodiment in that multiple color filter layers of different colors are included. In this embodiment, a pattern made of a material having a low light transmittance is a blue resist pattern included in multiple color filter layers. Descriptions of other configurations that are the same as those according to the first embodiment are not repeated.

A plan view of the solid-state image pickup device according to this embodiment is the same as that in FIG. 4, which illustrates the first embodiment. A method of forming a pattern in such a solid-state image pickup device according to this embodiment will be described with reference to FIGS. 3A to 3D and part of FIG. 1. FIGS. 3A to 3D are schematic sectional views and illustrate the method of forming a pattern according to this embodiment. Similar to the first embodiment, FIGS. 3A to 3D are schematic sectional views taken along line IA to IE in FIG. 4 and illustrate only the essential part of the solid-state image pickup device.

The method of forming a pattern according to this embodiment is the same as that of the first embodiment up to the step of removing the flattening layer 109 disposed on the insulating layer 105 (FIG. 1C).

Figure 3A:
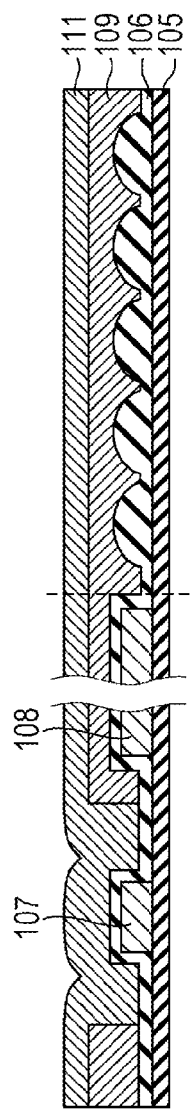
FIGS. 3A to 3D are schematic sectional views of a method of forming a pattern according to a second embodiment.

Subsequent to the step illustrated in FIG. 1C, a film of a material having a high alignment-light transmittance is formed, as illustrated in FIG. 3A. A material having a high alignment-light transmittance is, for example, a green resist or a red resist. In this embodiment, a green resist is used, and as illustrated in FIG. 3A, a green resist layer 111 is formed in the effective pixel region 101 and the periphery region 102.

Figure 3B:
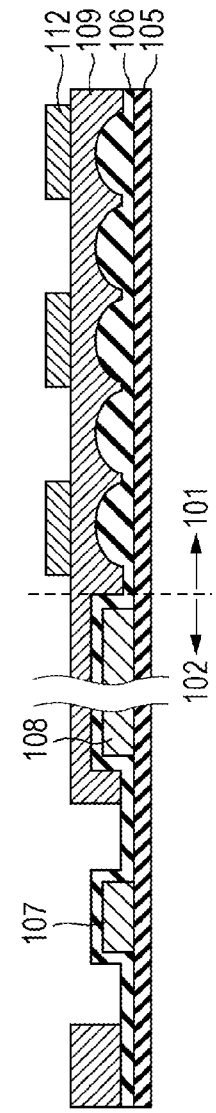

Then, a green resist pattern 112 is formed in the effective pixel region 101 by exposing and developing the green resist layer 111 using photolithography (FIG. 3B). Since alignment-light transmittance of the green resist layer 111 is high, the alignment mark 107 can be detected by a typical method without any problem.

Figure 3C:
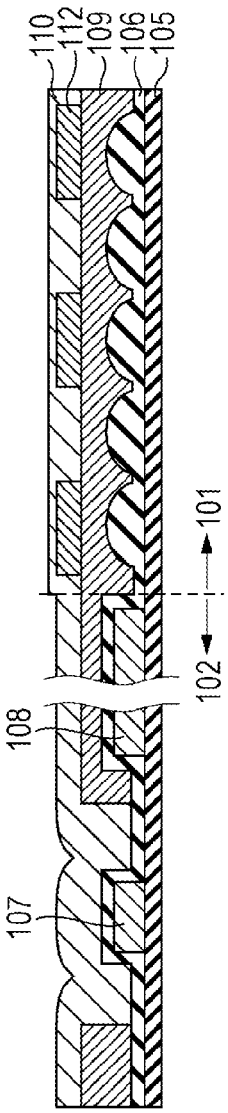

Subsequently, a film of a material having a low alignment-light transmittance is formed. Similar to the first embodiment, the material having a low alignment-light transmittance in this embodiment is a blue resist. As illustrated in FIG. 3C, the blue resist layer 110 is formed over the green resist pattern 112 in the effective pixel region 101 and the periphery region 102.

Figure 3D:
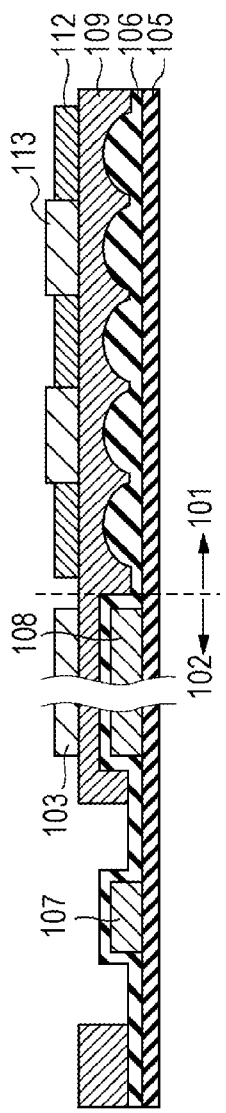

Then, the blue light-shielding pattern 103 in the periphery region 102 and a blue resist pattern 113 in the effective pixel region 101 are formed simultaneously by forming patterns in the blue resist layer 110 through exposure and development using photolithography (FIG. 3D). The blue resist layer 110 is removed from above and around the alignment mark 107. The blue resist layer 110 can be removed from above and around the alignment mark 107 at the same time the blue resist pattern 113 is being formed. Similar to the first embodiment, by detecting the alignment mark using the surface depression in the blue resist layer 110, the blue resist pattern 113 can be formed precisely.

As described above, when the method of forming a pattern according to the present invention is used for a single-CMOS solid-state image pickup device, highly precise alignment is possible without increasing the number of steps in the process. The structure of the alignment mark in the single-CMOS solid-state image pickup device according to the present invention enables highly precise alignment in fewer steps.

In this embodiment, patterning of the green resist layer is performed before performing patterning of the blue resist layer. After patterning the blue resist layer, a red resist layer may be patterned. The orders of these steps of patterning are interchangeable. A green resist is used as a material having a high alignment-light transmittance. Instead, materials of other colors (red and complimentary colors) may be used. Similarly, a blue resist is used as a material having a low alignment-light transmittance. Instead, materials of other colors may be used so long as $T \leqq 5\%$, where T represents the average spectral transmittance in the wavelength band of the exposure alignment light. The colors in the filter layers are not limited to green and blue and may be more than two.

Third Embodiment

A single-CMOS solid-state image pickup device according to this embodiment has the configuration same as that according to the second embodiment. In this embodiment, the step subsequent to the step of forming a color filter layer of the solid-state image pickup device according to the second embodiment is described. The configurations that are the same as those according to the second embodiment will not be repeated. This embodiment may also be applied to the first embodiment.

Figure 5:
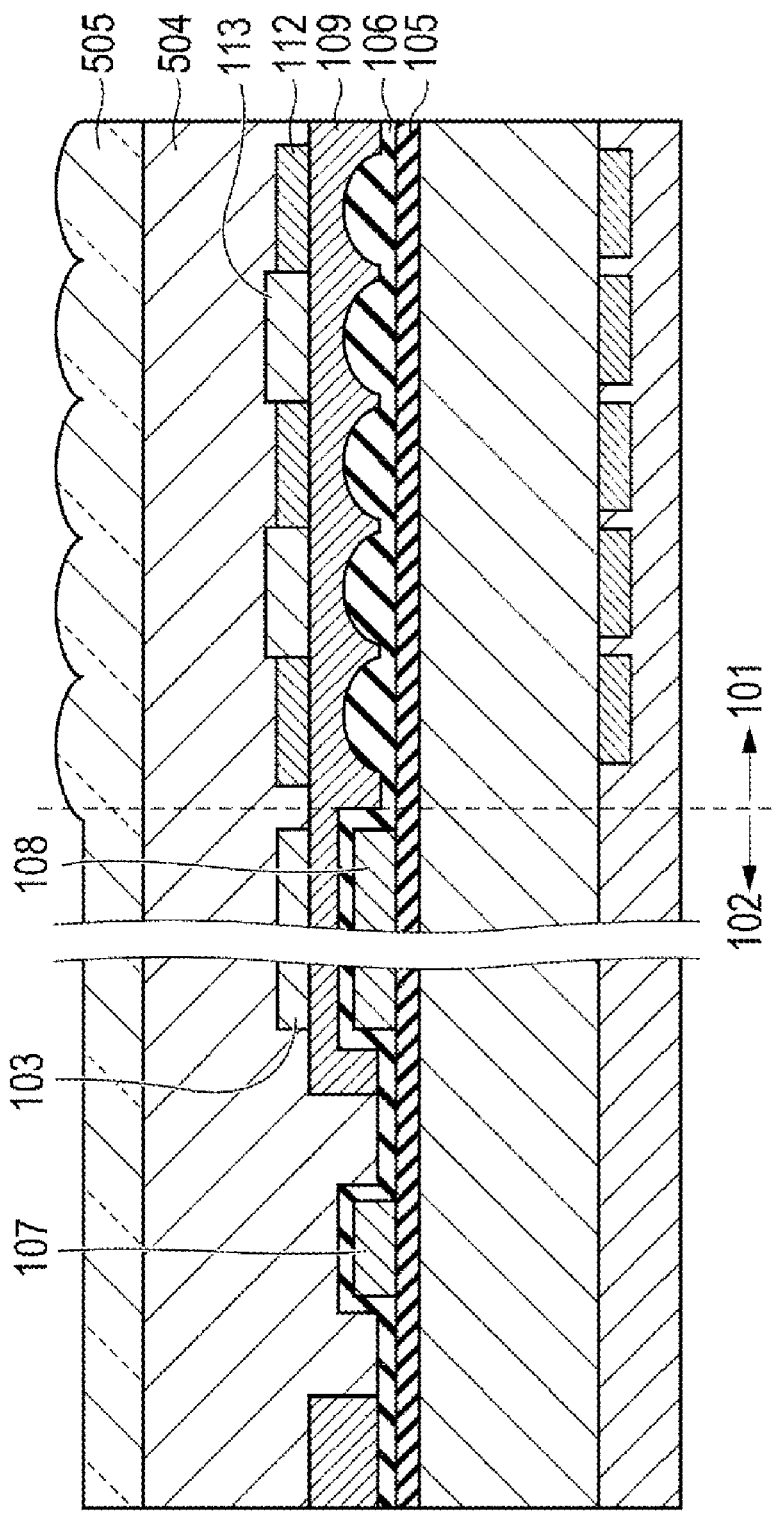
FIG. 5 is a schematic sectional view of a method of forming a pattern according to a third embodiment.

FIG. 5 is a schematic sectional view of the solid-state image pickup device and illustrates the step subsequent to the step illustrated in FIG. 3D. After forming the blue resist pattern 113, a flattening layer 504 made of organic materials is formed, and a microlens array 505 is formed. For example, the organic materials are resin or resist. The microlens array 505 formed above the blue resist pattern 113 is formed by using the alignment mark 107 for alignment. A method of forming the microlens array 505 will be described below.

The flattening layer 504, which is made of resin, is formed above the alignment mark 107 and color filter layers. Then, a microlens layer, which is made of a photosensitive material, is formed. The microlens layer is patterned into a rectangle by exposing and developing it. Before the exposure, alignment is performed using the alignment mark 107. The patterned microlens layer is disposed to correspond to the photoelectric conversion units. The microlens array 505 is formed by deforming the patterned microlens layer into hemispheres by reflowing (FIG. 5).

Since the blue resist layer 110 is removed from above and around the alignment mark 107, the alignment mark 107 can be used in the subsequent for highly precise alignment. Since alignment is performed in the subsequent steps using the alignment mark 107, the positional precision of the components is improved.

The method of forming the microlens array 505 is not limited to the method described above. For example, a microlens layer may include a microlens material layer and a photosensitive material layer disposed on the microlens material layer. The photosensitive layer of the microlens layer is patterned through exposure and development based on the alignment. The microlens array 505 can be formed by deforming the patterned photosensitive material layer by reflow, and etching the microlens material layer by using the deformed photosensitive layer as a mask. In another method, the microlens layer may be made of a photosensitive material layer. Then, the microlens layer can be exposed using a gradation mask on the basis of the alignment. By developing the microlens layer, the microlens layer is patterned to form a microlens array. The light transmittance of the gradation mask is controlled by the area of a fine pattern not resolved after exposure. For example, the light transmittance is controlled by the density of a predetermined fine pattern or the size of the fine pattern. The gradation mask may be a gray scale mask of which the light-shielding ability is appropriately adjusted. Specifically, the gradation mask may be a multi-tone mask, a half-tone mask, a gray-tone mask, etc. Any of the above-described methods of forming a microlens can be used. By using the above-described alignment mark 107 for alignment in the patterning steps or the exposure steps, the positional precision of the components can be improved.

In this embodiment, a photosensitive material is used as the material having a low alignment-light transmittance. Instead, a light-shielding metal, such as aluminum, may be used. For example, when aluminum is used, a surface depression formed in the aluminum layer when the aluminum layer is formed, which is similar to the surface depressions in the first and second embodiments, can be used. The alignment mark is not limited to a protrusion in a metal pattern. Instead, the alignment mark may be a depression formed by etching the insulating layer. In this embodiment, the material having a low alignment-light transmittance is removed from above and around the alignment mark. Instead, the material may be left in the area above and around the alignment mark.

The application of the present invention is not limited to CCD or CMOS solid-state image pickup devices. The present invention may be applied to other optical function devices having color filter layers and light shielding layer, e.g., display apparatuses such as liquid crystal displays. The embodiments may be appropriately combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-127074 filed Jun. 2, 2010 and No. 2011-107731 filed May 13, 2011, which are hereby incorporated by reference herein in their entirety.

What is claimed is:

1. A method of forming a pattern comprising:
   forming a first pattern including a depressed or protruding alignment mark above a substrate;
   forming a flattening layer on the first pattern;
   removing a part of the flatting layer above the alignment mark;
   forming a processed layer on the flattening layer to cover the alignment mark;
   performing alignment by optically detecting a position of the alignment mark from above the processed layer, using light; and
   forming a second pattern by patterning the processed layer based on the alignment.

2. The method according to claim 1, wherein
   the flattening layer includes a photosensitive material, and
   the removing includes exposing the flattening layer and developing the exposed flattening layer.

3. The method according to claim 1, wherein the processed layer includes a blue resist layer.

4. The method according to claim 1, wherein the first pattern includes a wiring layer.

5. The method according to claim 1, wherein the forming the second pattern includes removing a part of the processed layer above the alignment mark.

6. The method according to claim 5, further comprises:
   forming a third pattern above the second pattern using the alignment mark.

7. The method according to claim 6, wherein the third pattern includes a microlens.

8. A method of producing a solid-state image pickup device comprising:
   forming a wiring layer including a depressed or protruding alignment mark above a substrate including a photoelectric conversion unit;
   forming a flattening layer on the wiring layer;
   removing a part of the flattening layer above the alignment mark in the wiring layer;
   forming a blue resist layer on the flattening layer with the part removed;
   performing alignment by optically detecting the position of the alignment mark from above the blue resist layer, using light;
   forming a blue color filter by patterning the blue resist layer on the basis of the alignment;
   removing a part of the blue resist layer above the alignment mark;
   forming a microlens layer above the alignment mark after removing a part of the blue resist layer;
   performing alignment by optically detecting the position of the alignment mark from above the microlens layer, using light; and
   forming a microlens by patterning or exposing the microlens layer on the basis of the alignment.

9. The method of producing a solid-state image pickup device according to claim 8, wherein
   the microlens layer includes a photosensitive material layer, and
   the step of forming a microlens includes reflowing the patterned photosensitive material.

10. The method of producing a solid-state image pickup device according to claim 8, wherein
    the microlens layer includes a microlens material layer and a photosensitive material layer disposed on the microlens material layer, and
    the step of forming a microlens includes reflowing the patterned photosensitive material and etching the microlens material layer using the reflowed photosensitive material as a mask.

11. The method of producing a solid-state image pickup device according to claim 8, wherein
    the microlens layer includes a photosensitive material layer, and
    the step of forming a microlens includes exposing using a gradation mask.

* * * * *